United States Patent
Sagawa et al.

(10) Patent No.: US 10,522,638 B2
(45) Date of Patent: Dec. 31, 2019

(54) SEMICONDUCTOR CHIP AND POWER MODULE, AND MANUFACTURING METHOD OF THE SAME

(71) Applicant: HITACHI POWER SEMICONDUCTOR DEVICE, LTD., Hitachi-shi, Ibaraki (JP)

(72) Inventors: Masakazu Sagawa, Tokyo (JP); Takahiro Morikawa, Tokyo (JP); Motoyuki Miyata, Tokyo (JP); Kan Yasui, Ibaraki (JP); Toshiaki Morita, Ibaraki (JP)

(73) Assignee: HITACHI POWER SEMICONDUCTOR DEVICE, LTD., Ibaraki (JP)

(*) Notice: Subject to any disclaimer, the term of this patent is extended or adjusted under 35 U.S.C. 154(b) by 0 days.

(21) Appl. No.: 16/153,251

(22) Filed: Oct. 5, 2018

(65) Prior Publication Data
US 2019/0157412 A1   May 23, 2019

(30) Foreign Application Priority Data

Nov. 17, 2017 (JP) .................................. 2017-221869

(51) Int. Cl.
*H01L 29/45*  (2006.01)
*H01L 23/00*  (2006.01)
(Continued)

(52) U.S. Cl.
CPC .......... *H01L 29/45* (2013.01); *H01L 23/3735* (2013.01); *H01L 23/49811* (2013.01); *H01L 24/05* (2013.01); *H01L 24/06* (2013.01); *H01L 24/48* (2013.01); *H01L 25/07* (2013.01); *H01L 24/45* (2013.01); *H01L 24/73* (2013.01); *H01L 24/83* (2013.01); *H01L 24/85* (2013.01); *H01L 29/7802* (2013.01); *H01L 2224/0345* (2013.01); *H01L 2224/03848* (2013.01); *H01L 2224/04042* (2013.01); *H01L 2224/0567* (2013.01); *H01L 2224/0568* (2013.01); *H01L 2224/05082* (2013.01); *H01L 2224/05166* (2013.01); *H01L 2224/05553* (2013.01); *H01L 2224/05624* (2013.01); *H01L 2224/05666* (2013.01);
(Continued)

(58) Field of Classification Search
CPC ...................... H01L 2224/0508–05098; H01L 2224/4503–45034; H01L 2224/05124; H01L 2224/45124
See application file for complete search history.

(56) References Cited

U.S. PATENT DOCUMENTS 9,153,536 B2   10/2015   Okuno et al.

FOREIGN PATENT DOCUMENTS

JP   2000-228402 A   8/2000
JP   2008-177378 A   7/2008
(Continued)

*Primary Examiner* — Amar Movva
(74) *Attorney, Agent, or Firm* — Miles & Stockbridge, PC

(57) ABSTRACT

A semiconductor chip includes a semiconductor substrate made of SiC, a front surface electrode formed in a principal surface of the semiconductor substrate, and a rear surface electrode (drain electrode) formed in a rear surface of the semiconductor substrate. The front surface electrode is bonded to a wire, and includes an Al alloy film containing a high melting-point metal. The Al alloy film contains a columnar Al crystal which extends along a thickness direction of the Al alloy film, and an intermetallic compound is precipitated therein.

15 Claims, 13 Drawing Sheets

(51) Int. Cl.
*H01L 23/373* (2006.01)
*H01L 23/498* (2006.01)
*H01L 25/07* (2006.01)
*H01L 29/78* (2006.01)

(52) U.S. Cl.
CPC .......... *H01L 2224/05669* (2013.01); *H01L 2224/05671* (2013.01); *H01L 2224/05672* (2013.01); *H01L 2224/05679* (2013.01); *H01L 2224/05681* (2013.01); *H01L 2224/05683* (2013.01); *H01L 2224/05684* (2013.01); *H01L 2224/0603* (2013.01); *H01L 2224/06051* (2013.01); *H01L 2224/29101* (2013.01); *H01L 2224/29347* (2013.01); *H01L 2224/32225* (2013.01); *H01L 2224/45124* (2013.01); *H01L 2224/45147* (2013.01); *H01L 2224/45565* (2013.01); *H01L 2224/4847* (2013.01); *H01L 2224/48227* (2013.01); *H01L 2224/48247* (2013.01); *H01L 2224/73265* (2013.01); *H01L 2224/8384* (2013.01); *H01L 2224/83801* (2013.01); *H01L 2224/85447* (2013.01); *H01L 2924/0133* (2013.01); *H01L 2924/01072* (2013.01); *H01L 2924/01327* (2013.01); *H01L 2924/10253* (2013.01); *H01L 2924/10272* (2013.01); *H01L 2924/13091* (2013.01)

(56) References Cited

FOREIGN PATENT DOCUMENTS

| | | | |
|---|---|---|---|
| JP | 2012-243876 | A | 12/2012 |
| JP | 2016-219531 | A | 12/2016 |

SEMICONDUCTOR CHIP AND POWER MODULE, AND MANUFACTURING METHOD OF THE SAME

BACKGROUND OF THE INVENTION

1. Field of the Invention

The present invention relates to a semiconductor chip which enables a high-temperature operation, a power module, and a manufacturing method of the power module.

2. Description of the Related Art

In recent years, a development of a wide-gap semiconductor such as SiC which enables a high-temperature operation is being speeded up. While a Si (silicon) semiconductor chip has an upper limit of 150 to 175° C. in an operation temperature, a SiC semiconductor chip is considered to be operated at 175° C. or more.

Then, when a use environmental temperature becomes high, there is a need to consider a bonding performance between a front surface electrode of the semiconductor chip and a wire, and a thermal resistance of members surrounding the semiconductor chip.

Further, as a structure of the front surface electrode of the semiconductor chip to be bonded to the wire, JP 2000-228402 A discloses a structure in which the front surface electrode is configured by three layers, that is, a molybdenum-silicide film, an aluminum silicon film, and an aluminum film.

In addition, JP 2008-177378 A discloses a semiconductor device using a sintered layer as a die bonding material, in which an electrode of a semiconductor element and a wiring layer of an insulating substrate are bonded through the sintered layer.

In addition, JP 2012-243876 A and JP 2016-219531 A disclose an electrode structure of an Al alloy film which is used in a semiconductor device.

SUMMARY OF THE INVENTION

For example, in the structure for bonding an Al wire to the front surface electrode of the semiconductor chip, there is a need to increase a mechanical strength of each of the Al wire and the front surface electrode of the semiconductor chip in order to improve the bonding strength. In order to increase the mechanical strength of the Al wire, there is proposed a high-strength Al wire in which a high melting-point metal is mixed.

However, if the strength of the front surface electrode of the semiconductor chip is insufficient, as a result, the bonding portion of the front surface electrode of the wire is stressed when the power cycle evaluation is implemented, and a small crack occurs. As the crack is developed along the bonding portion, the semiconductor chip and a power module are reduced in their life spans.

An object of the invention is to provide a technology which can extend the life spans of the semiconductor chip and the power module in a power cycle evaluation by increasing the strength of the electrode.

Other objects and novel characteristics besides the above description of this disclosure will be apparent through the explanation and the accompanying drawings of this specification.

In the invention disclosed in this application, representative outlines will be simply described as below.

A semiconductor chip according to an embodiment includes a semiconductor substrate, and a front surface electrode which is formed in a principal surface of the semiconductor substrate, wherein the front surface electrode includes an Al alloy film which contains a high melting-point metal, and the Al alloy film contains a columnar Al crystal along a thickness direction of the Al alloy film.

In addition, a power module according to an embodiment includes a semiconductor chip which includes a principal surface and a rear surface, and is provided with the front surface electrode formed in the principal surface, the substrate which supports the semiconductor chip and includes a wiring portion, and a conductive member which electrically connects the front surface electrode of the semiconductor chip and the wiring portion of the substrate. Further, the front surface electrode of the semiconductor chip includes an Al alloy film which contains a high melting-point metal. The Al alloy film contains a columnar Al crystal which extends along a thickness direction of the Al alloy film.

In addition, a manufacturing method of a power module according to an embodiment includes (a) mounting a semiconductor chip on a substrate provided with a wiring portion, the semiconductor chip including a principal surface and a rear surface, and being provided with a front surface electrode which is formed in the principal surface and includes an Al alloy film containing a high melting-point metal, and (b) electrically connecting the front surface electrode of the semiconductor chip and the wiring portion of the substrate by a conductive member. Herein, the Al alloy film of the front surface electrode of the semiconductor chip contains a columnar Al crystal which extends along a thickness direction of the Al alloy film.

Making an explanation simply about an effect obtained by the representative outline in the invention disclosed in this application, the following effect is obtained.

The bonding strength between the front surface electrode of the semiconductor chip and the wire is increased, so that it is possible to extend life spans of the semiconductor chip and the power module in a power cycle evaluation.

DESCRIPTION OF THE PREFERRED EMBODIMENTS

Figure 1:
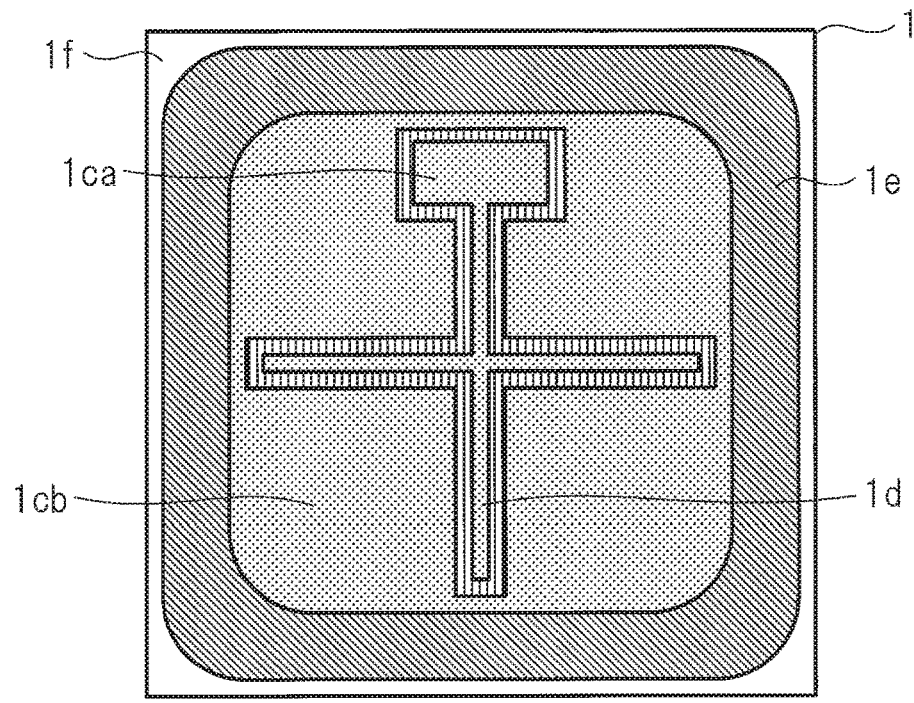
FIG. 1 is a top view illustrating an example of a configuration of a semiconductor chip according to an embodiment of the invention.
Figure 2:
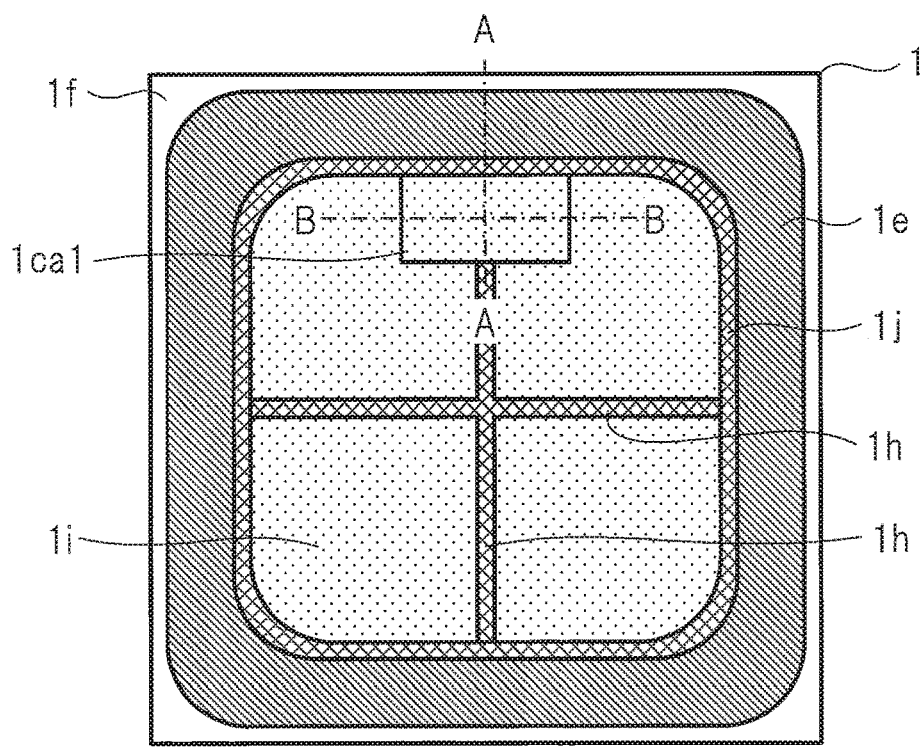
FIG. 2 is a top view illustrating an example of a configuration in which an electrode is taken out from the semiconductor chip illustrated in FIG. 1.
Figure 3:
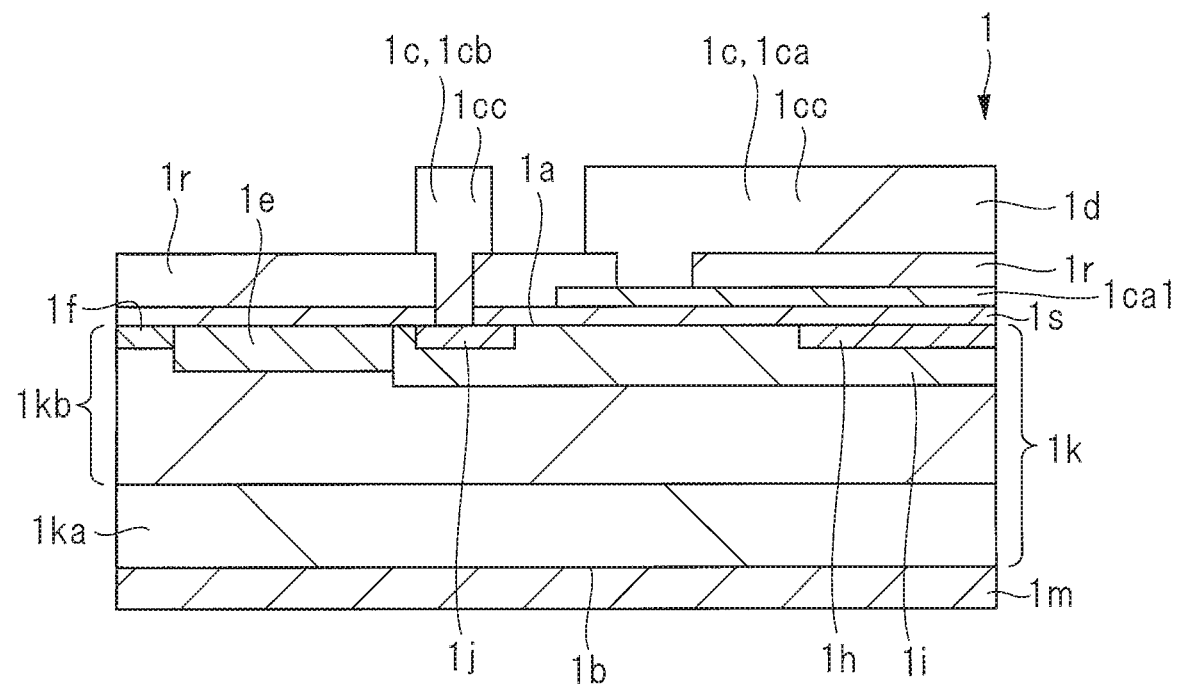
FIG. 3 is a cross-sectional view illustrating a portion taken along line A-A of the structure illustrated in FIG. 2 on a magnified scale.
Figure 4:
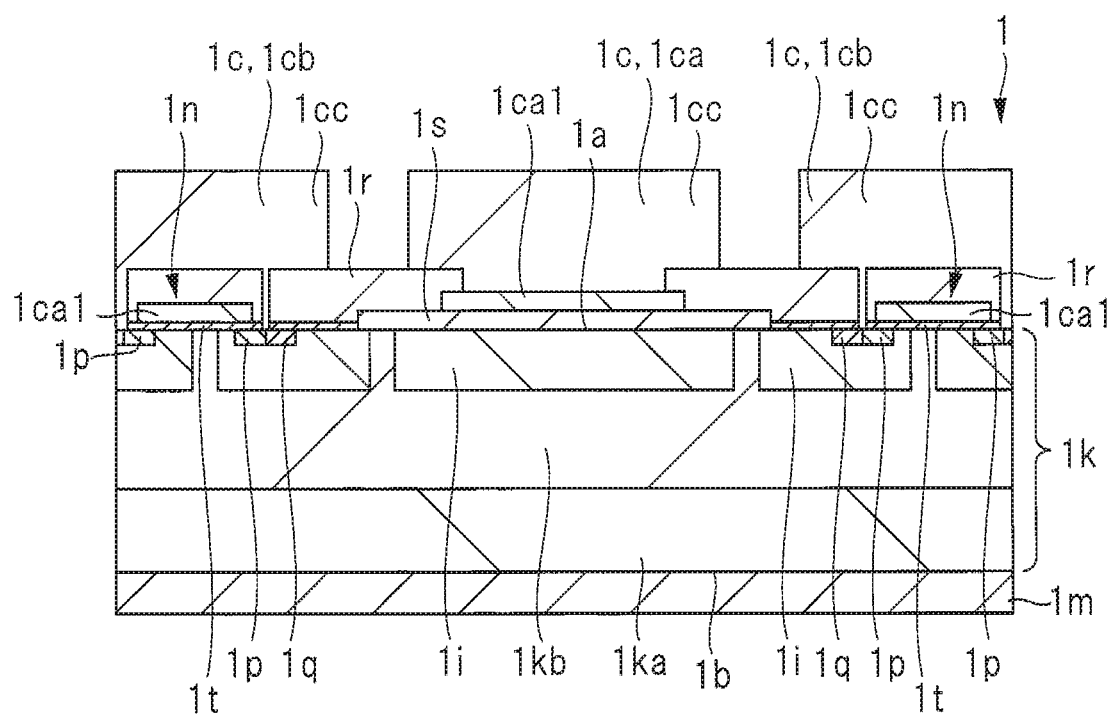
FIG. 4 is a cross-sectional view illustrating a portion taken along line B-B of the structure illustrated in FIG. 2 on a magnified scale.
Figure 5:
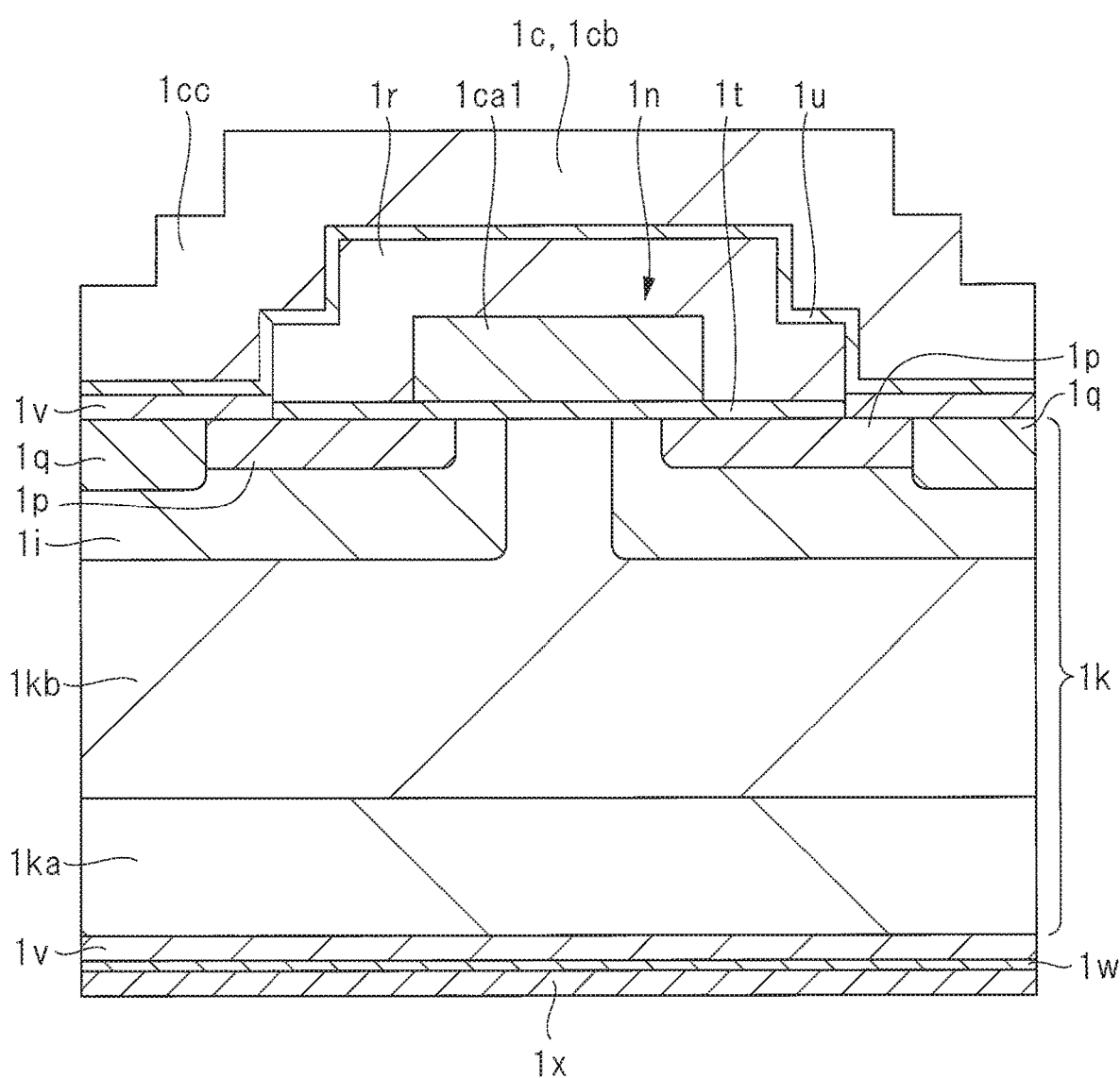
FIG. 5 is an enlarged cross-sectional view illustrating an example of main parts of the structure illustrated in FIG. 4.

FIG. 1 is a top view illustrating an example of a configuration of a semiconductor chip according to an embodiment of the invention. FIG. 2 is a top view illustrating an example of a configuration in which an electrode is taken out from the semiconductor chip illustrated in FIG. 1. FIG. 3 is a cross-sectional view illustrating a portion taken along line A-A of the structure illustrated in FIG. 2 on a magnified scale. FIG. 4 is a cross-sectional view illustrating a portion taken along line B-B of the structure illustrated in FIG. 2 on a magnified scale. FIG. 5 is an enlarged cross-sectional view illustrating an example of main parts of the structure illustrated in FIG. 4.

First, the structure of the semiconductor chip of this embodiment will be described using FIGS. 1 to 4.

A semiconductor chip 1 of this embodiment illustrated in FIG. 1 includes a metal oxide semiconductor field effect transistor (MOSFET) as an example, and is mounted on a power module. In this embodiment, the description will be given about a case where a semiconductor substrate 1k (see FIG. 3) in the semiconductor chip 1 is made of SiC enabling an operation at a high temperature of 175° C. or more.

FIG. 1 illustrates a top view of an electrode layout in the semiconductor chip 1 (MOSFET), in which a gate electrode 1ca and a cross-shaped gate wiring 1d linked to the gate electrode 1ca are formed. Further, a source electrode 1cb is disposed around the gate electrode 1ca and the gate wiring 1d with a desired gap from each of the gate electrode 1ca and the gate wiring 1d. In other words, the gate electrode 1ca and the gate wiring 1d are surrounded by the source electrode 1cb with a desired gap in top view. The outer shape of the source electrode 1cb in top view is an approximate rectangular shape.

Then, a termination region 1e is disposed around the outer side of the source electrode 1cb in top view, and an n-type channel stopper region 1f is disposed around the termination region 1e.

Further, as illustrated in the top view from which the electrode illustrated in FIG. 2 is taken out, a gate electrode 1ca1 is disposed at a place corresponding to the gate electrode 1ca of FIG. 1, and partially overlapped with the gate electrode 1ca1. A cross-shaped potential fixing region 1h is disposed at a place corresponding to the gate wiring 1d of FIG. 1. Then, a P-type body layer 1i is disposed in a region corresponding to the source electrode 1cb of FIG. 1.

In addition, in the top view illustrated in FIG. 2, a P-type semiconductor region 1j is viewed around the outer side of the P-type body layer 1i, and the termination region 1e is viewed around the outer side of the P-type semiconductor region 1j.

Next, the description will be given about a cross-sectional structure of main parts of the semiconductor chip 1 illustrated in FIGS. 3 and 4. The semiconductor substrate 1k, which is made of SiC and serves as a base, is configured by an n-type substrate 1ka and an epitaxial layer 1kb which is formed in the upper layer of the n-type substrate 1ka.

Then, as a front surface electrode 1c, the gate electrode 1ca and the source electrode 1cb are formed in a principal surface 1a of the semiconductor substrate 1k (the semiconductor chip 1). On the other hand, a drain electrode (rear surface electrode) 1m is formed in a rear surface 1b. In addition, a field insulating film is is formed on the principal surface 1a of the semiconductor substrate 1k, and a $SiO_2$ film which is an inter-layer insulating film 1r is formed on the field insulating film is.

Herein, the gate electrode 1ca is electrically connected to the gate electrode 1ca1 which is disposed in a lower layer through an opening of the inter-layer insulating film 1r. The source electrode 1cb is electrically connected to the P-type semiconductor region 1j which is disposed in a lower layer through the openings of the inter-layer insulating film 1r and the field insulating film is as illustrated in FIG. 3.

In addition, as illustrated in FIG. 4, a gate insulating film 1t is formed on the principal surface 1a in a region where a transistor 1n is formed, and the gate electrode 1ca1 is disposed on the gate insulating film 1t. Further, in the lower layer of the gate electrode 1ca1, an $n^+$-type source region 1p and a $p^+$-type potential fixing region 1q are formed through the gate insulating film 1t, and the transistor 1n is configured by the gate electrode 1ca1, the source region 1p, and the potential fixing region 1q.

That is, the plurality of transistors 1n are formed in the principal surface 1a of the semiconductor substrate 1k. In other words, in the semiconductor chip 1 of this embodiment, the plurality of transistors 1n are formed in the principal surface 1a of the semiconductor substrate 1k, and electrically connected to each other to form a power transistor. Then, each of the gate electrode 1ca, the source electrode 1cb, and the drain electrode 1m illustrated in FIGS. 3 and 4 serves as an external connection electrode of the power transistor.

In addition, the structure of FIG. 5 illustrates a detailed structure of a cross section of the main parts of the structure illustrated in FIG. 4. Making an explanation of the detailed structure of the rear surface electrode (the drain electrode 1m of FIG. 4) of the n-type substrate 1ka, a NiSi silicide film 1v is formed in the rear surface of the n-type substrate 1ka, a Ti electrode 1w is formed in the surface of the silicide film 1v, and a Ni electrode 1x is formed in the surface of the Ti electrode 1w.

In the semiconductor chip 1 of this embodiment, the front surface electrode 1c includes an Al alloy film 1cc which contains a high melting-point metal. In other words, the gate electrode 1ca and the source electrode 1cb illustrated in FIGS. 3 and 4 each include the Al alloy film 1cc which contains a high melting-point metal. Making an explanation on the structure using the enlarged view illustrated in FIG. 5, the Al alloy film 1cc which is a film formed in the upper layer of the gate electrode 1ca1 and connected with a wire contains a high melting-point metal.

Herein, the high melting-point metal is any one of Ta, Nb, Re, Zr, W, Mo, V, Hf, Ti, Cr, and Pt for example. In this embodiment, a case where the Al alloy film 1cc contains Ta will be described as an example of the high melting-point metal. In other words, the front surface electrode 1c having the Al alloy film 1cc illustrated in FIG. 5 is also an electrode made of an Al—Ta—Si alloy film.

Figure 6:
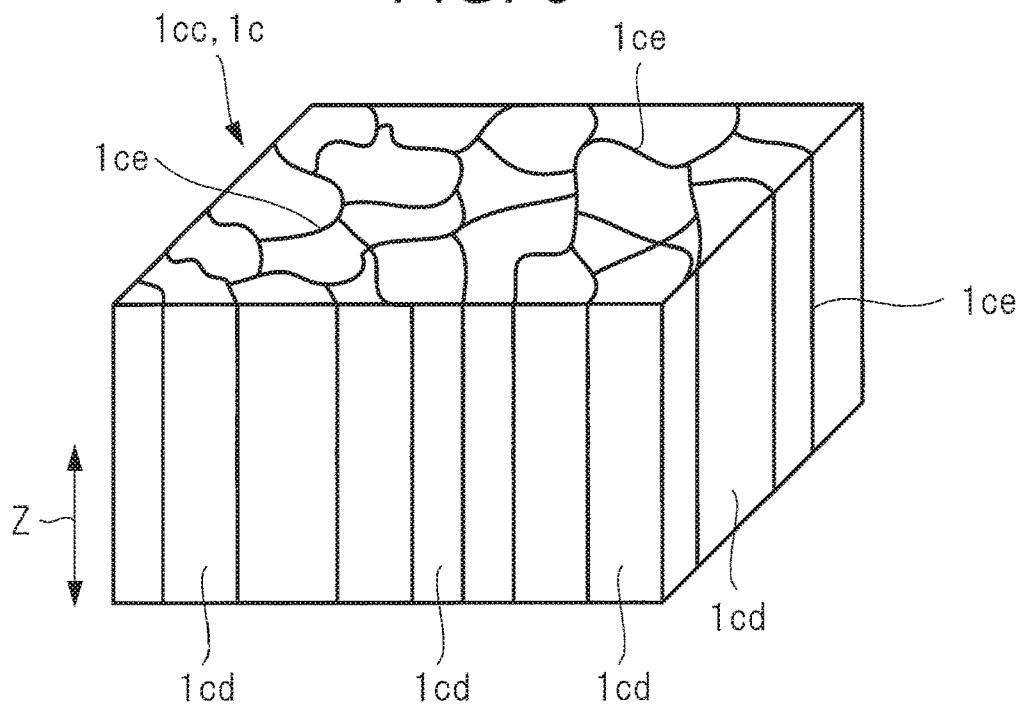
FIG. 6 is a schematic diagram illustrating a structure right after sputtering an Al alloy film of the electrode illustrated in FIG. 5.
Figure 7:
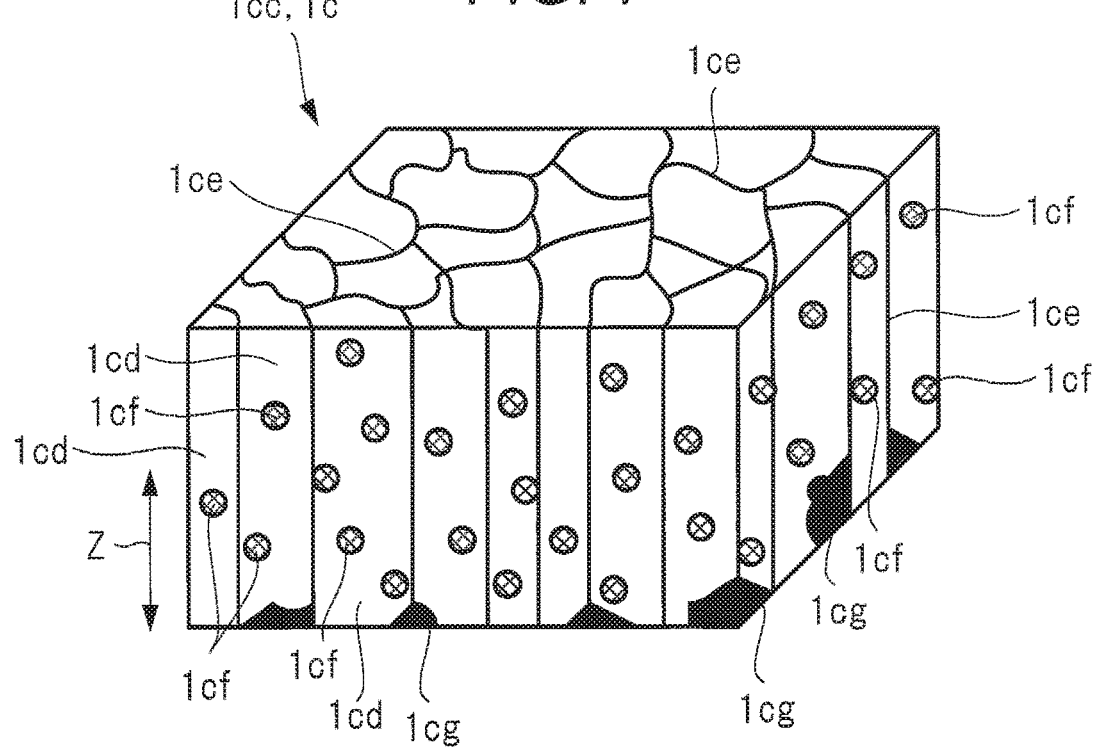
FIG. 7 is a schematic view illustrating a structure after heating the Al alloy film of the electrode illustrated in FIG. 6.

Next, FIG. 6 is a diagram schematically illustrating a structure right after the Al alloy film of the electrode illustrated in FIG. 5 is sputtered. FIG. 7 is a diagram schematically illustrating a structure after heating the Al alloy film of the electrode illustrated in FIG. 6.

As described above, the Al alloy film 1cc containing the high melting-point metal is formed in the front surface electrode 1c of the semiconductor chip 1 of this embodiment.

Then, as illustrated in FIGS. 6 and 7, the Al alloy film 1cc includes a columnar Al crystal 1cd which extends along a thickness direction Z of the Al alloy film 1cc. In other words, the Al alloy film 1cc has a columnar crystal structure in which Al extends in the thickness direction Z of the Al alloy film 1cc.

Further, the Al alloy film 1cc illustrated in FIG. 6 is in a state right after being formed by sputtering, and a substrate temperature is room temperature. In other words, crystal grains of Al are first oriented in a (110) direction by sputtering so as to grow a columnar crystal 1cd. Then, the Al alloy film 1cc illustrated in FIG. 7 shows a state where the Al alloy film 1cc after sputtering is heated at 400° C. in an inert atmosphere. In other words, an intermetallic compound 1cf made of the high melting-point metal and Al can be precipitated in the Al alloy film 1cc by heat treatment after forming the film by sputtering as illustrated in FIG. 7. The intermetallic compound 1cf of this embodiment is the intermetallic compound 1cf of $Al_a$Ta. Further, Si grains 1cg are precipitated in the inter-layer insulating film 1r (see FIG. 5) of the Al crystal grain boundary ice.

Figure 8:
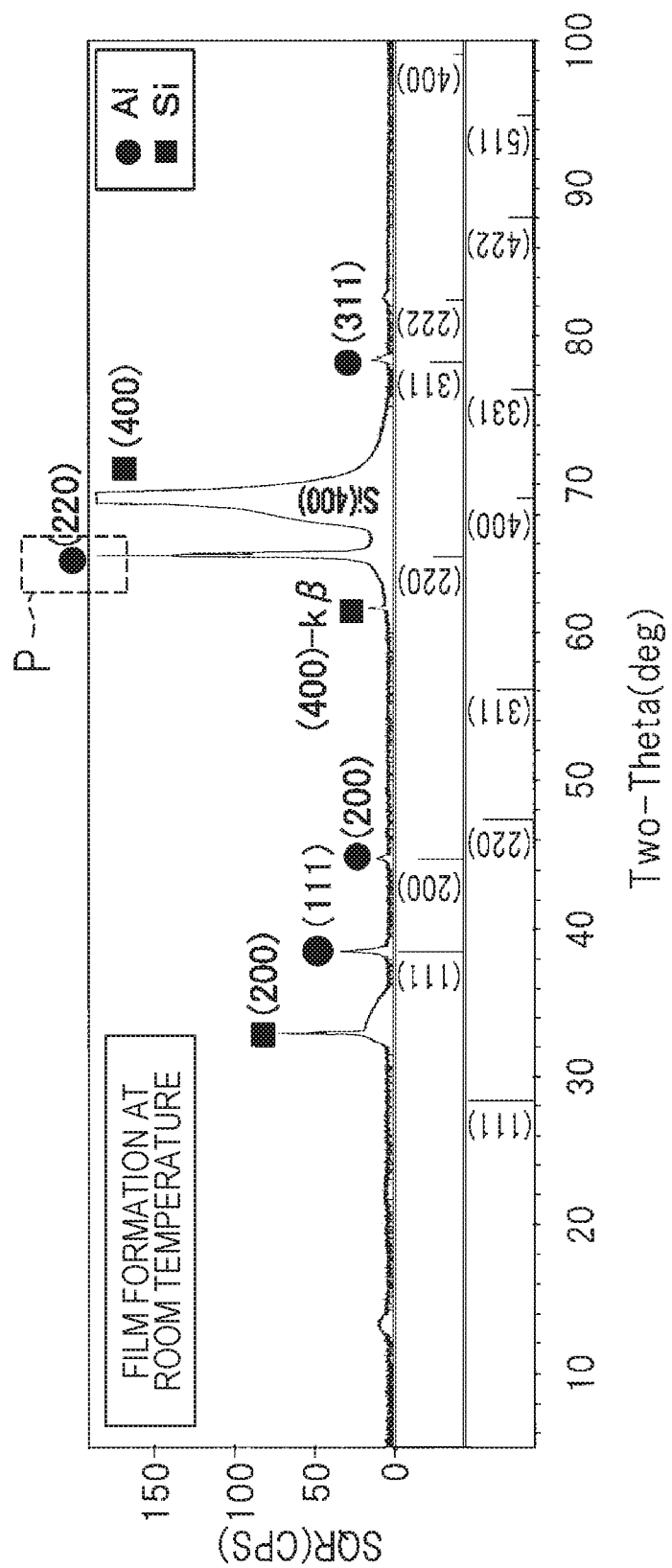
FIG. 8 is a diagram illustrating a wide-angle X-ray diffraction result of the Al alloy film when being formed at room temperature in the electrode of the structure illustrated in FIG. 6.
Figure 9:
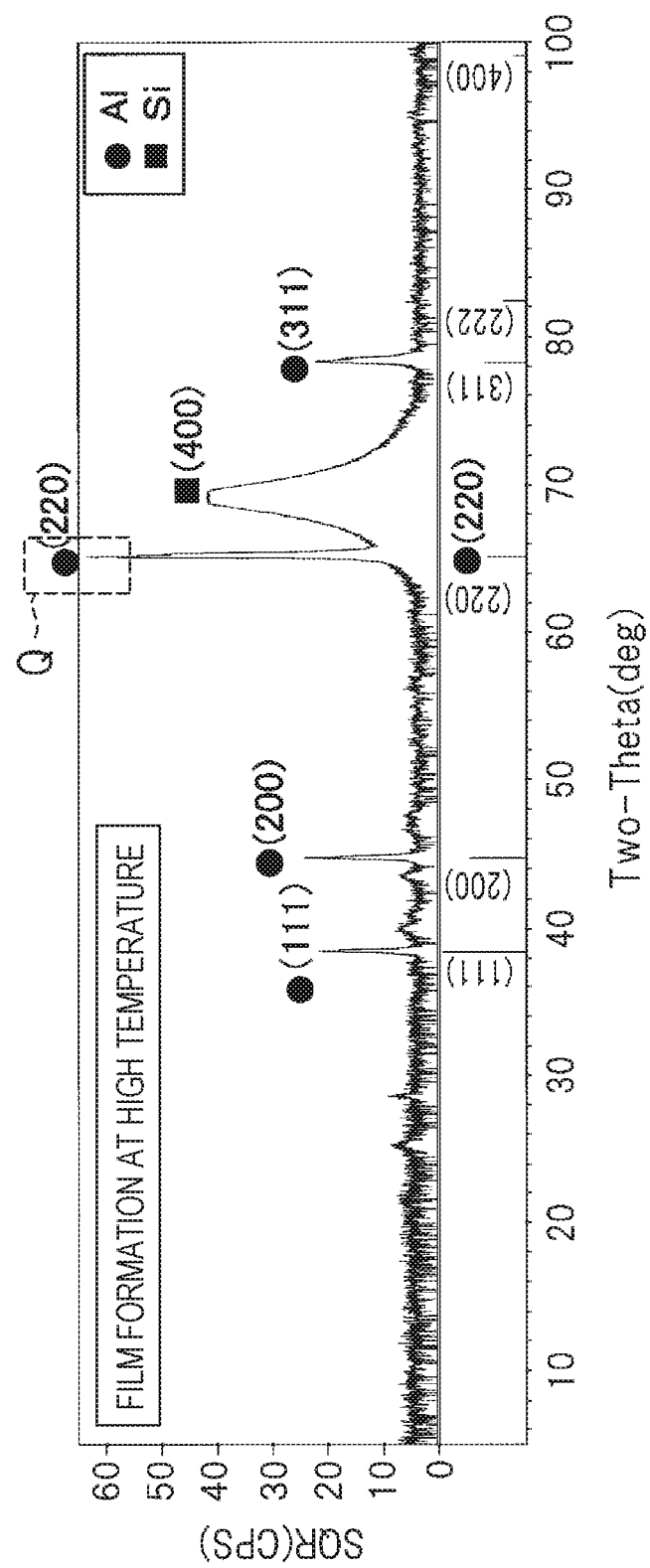
FIG. 9 is a diagram illustrating a wide-angle X-ray diffraction result of the Al alloy film when being formed at high temperature in the electrode of the structure illustrated in FIG. 6.

Herein, FIG. 8 is a diagram illustrating a wide-angle X-ray diffraction result of the Al alloy film when being formed at room temperature in the electrode of the structure illustrated in FIG. 6. FIG. 9 is a diagram illustrating a wide-angle X-ray diffraction result of the Al alloy film when being formed at high temperature in the electrode of the structure illustrated in FIG. 6.

As illustrated in FIGS. 8 and 9, in either the film forming at room temperature or at high temperature, there appear peaks (P portion illustrated in FIG. 8, and Q portion illustrated in FIG. 9) in a (110) plane ((220) plane) of the Al alloy film 1cc. Therefore, it can be seen that the (110) plane ((220) plane) is grown first.

Figure 10:
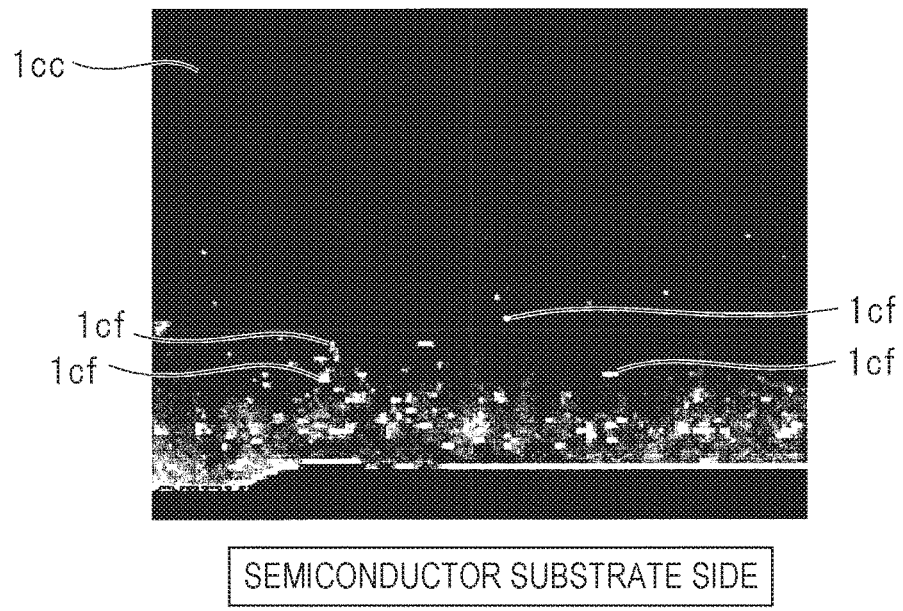
FIG. 10 is a diagram illustrating a TEM photograph of the structure of the Al alloy film after a power cycle test in the electrode of the semiconductor chip according to the embodiment of the invention.
Figure 11:
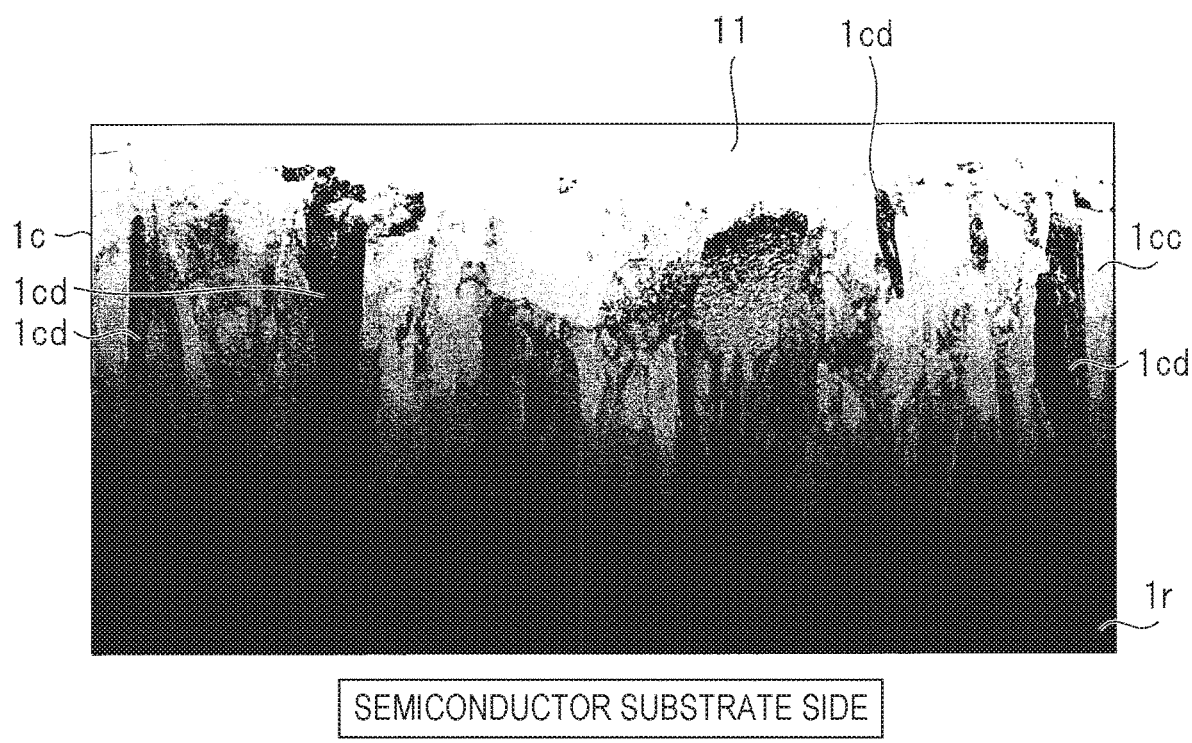
FIG. 11 is a diagram illustrating a TEM photograph of a columnar crystal structure of the Al alloy film after the power cycle test in the electrode of the semiconductor chip according to the embodiment of the invention.

In addition, FIG. 10 is a diagram illustrating a TEM photograph of the structure of the Al alloy film after a power cycle test in the electrode of the semiconductor chip according to the embodiment of the invention. FIG. 11 is a diagram illustrating a TEM photograph of a columnar crystal structure of the Al alloy film after the power cycle test in the electrode of the semiconductor chip according to the embodiment of the invention.

As illustrated in FIG. 10, it can be seen that the intermetallic compound 1cf is distributed in plural places in a particle state of about 100 nm in the semiconductor substrate in the Al alloy film 1cc even after the power cycle test. This distribution is the same as the structure of the Al alloy film 1cc before the power cycle test. Therefore, it can be determined that there is no structural change in the Al alloy film 1cc by the power cycle test.

In addition, as illustrated in FIG. 11, the columnar Al crystal 1cd can be found even after the power cycle test. It can be determined that there is no progress (growth) of a crack or a structural change.

According to the semiconductor chip 1 of this embodiment, in a metallic structure of the Al alloy film 1cc of the front surface electrode 1c, there are grain boundaries with a high density along a direction perpendicular to the Al alloy film 1cc (the thickness direction Z of the Al alloy film 1cc). The intermetallic compound 1cf of $Al_a$Ta are precipitated in plural places in the Al crystal grain boundary ice.

With this configuration, even when an Al crystal shear and a crack occur by thermal stress from a wire, the growth of the crystal shear and the crack along a horizontal direction (a surface direction of the front surface electrode 1c) can be hindered by the columnar Al crystal 1cd.

As a result, metal fatigue is hard to cause, and the bonding strength between the front surface electrode 1c of the semiconductor chip 1 and the wire is increased. Therefore, it is possible to expand a life span of the semiconductor chip 1 in a power cycle evaluation.

In addition, as illustrated in FIG. 5, the front surface electrode 1c to which the wire is bonded includes a barrier metal film (metal film) 1u in the lower layer of the Al alloy film 1cc. In other words, in the front surface electrode 1c, there is formed the barrier metal film 1u between the Al alloy film 1cc and the inter-layer insulating film ($SiO_2$ film) 1r of the lower layer thereof. The barrier metal film 1u is, for example, a laminated film in which a TiN film is formed on a Ti film.

In this way, in the front surface electrode 1c such as the gate electrode 1ca and the source electrode 1cb, the barrier metal film 1u is formed between the Al alloy film 1cc and the inter-layer insulating film 1r. Therefore, corrosion (flowing out) toward the Al substrate can be stopped. It is possible to prevent an electrical defect of the transistor 1n. Next, a power module of this embodiment will be described.

Figure 12:
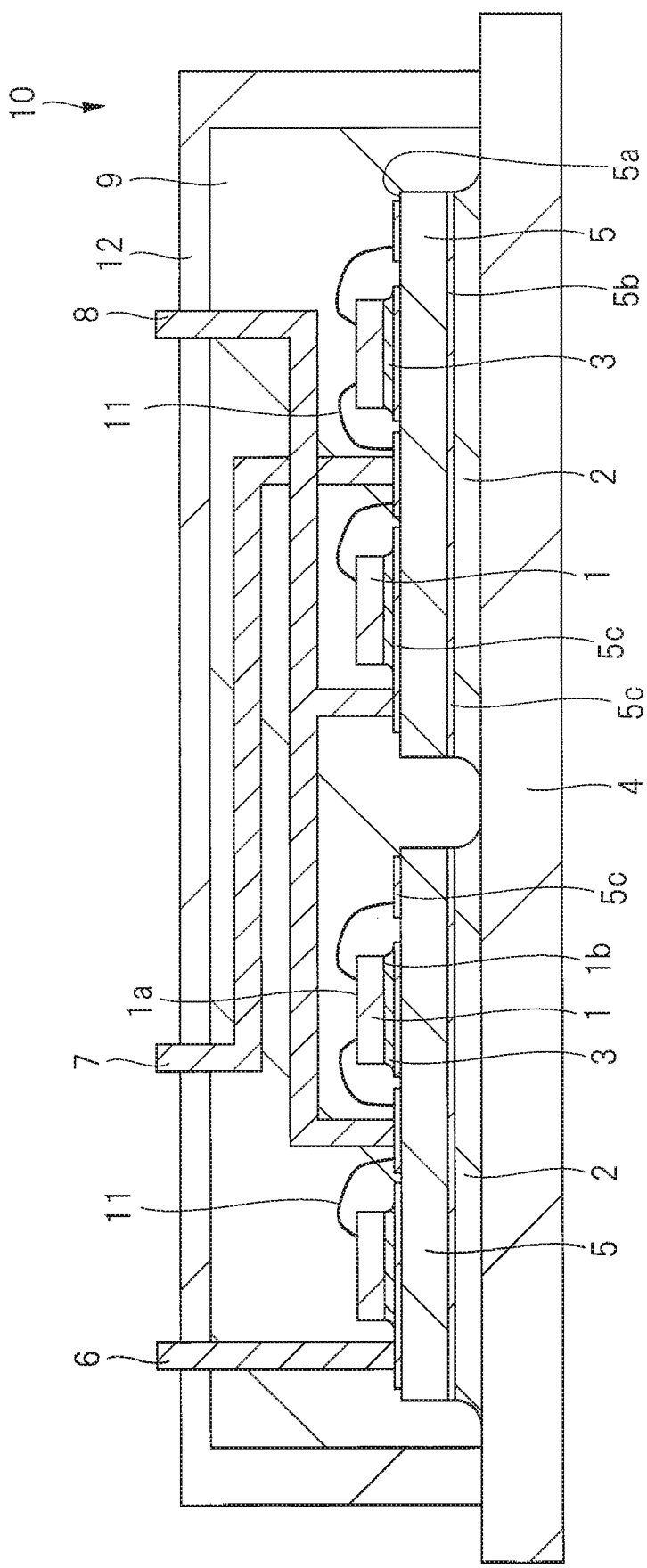
FIG. 12 is a cross-sectional view illustrating an example of a structure of a power module according to the embodiment of the invention.
Figure 13:
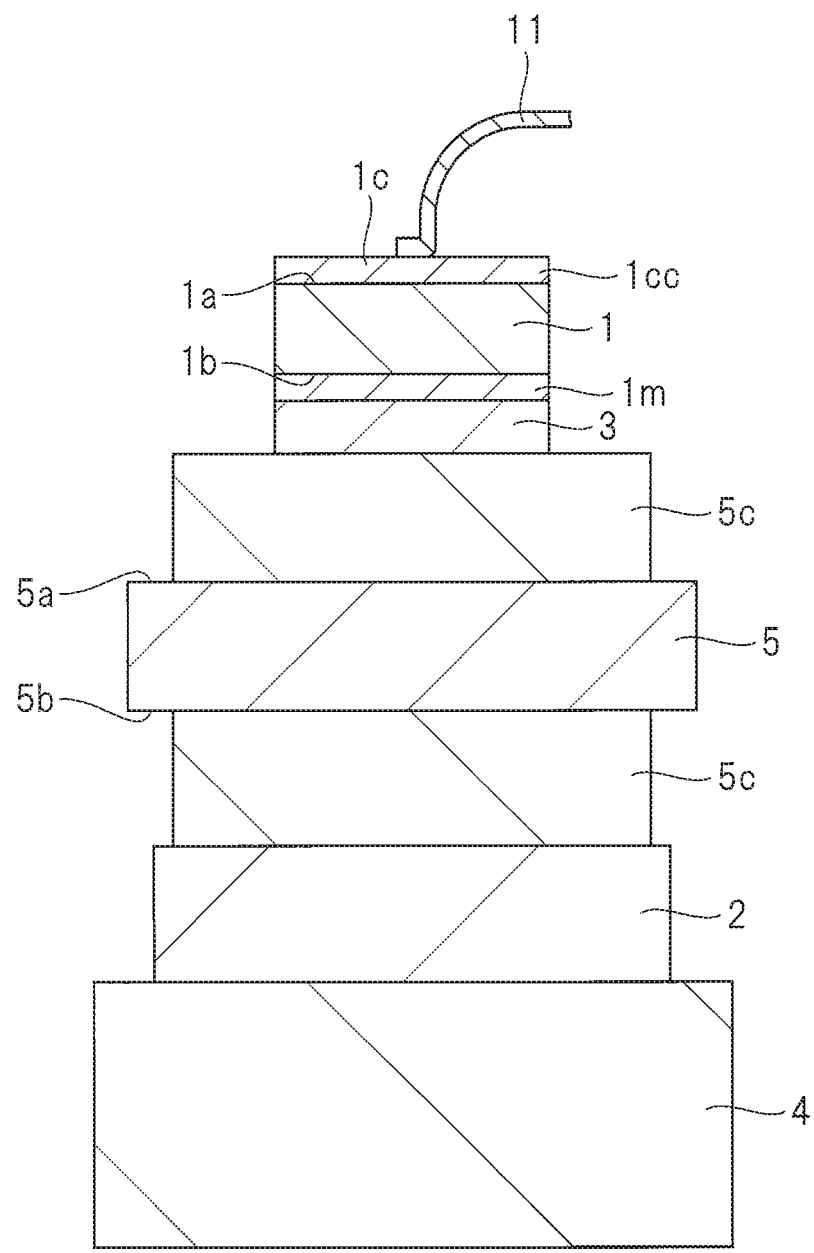
FIG. 13 is a cross-sectional view partially illustrating main parts of the structure of the power module according to the embodiment of the invention.

FIG. 12 is a cross-sectional view illustrating an example of the structure of the power module according to the embodiment of the invention. FIG. 13 is a cross-sectional view partially illustrating main parts of the structure of the power module according to the embodiment of the invention.

A power module 10 of this embodiment is, for example, a semiconductor module which is mounted in a railway vehicle or an automobile.

The configuration of the power module 10 will be described. The power module 10 includes a plurality of insulating substrates (substrates) 5 to support the semiconductor chip 1 of this embodiment. The plurality of semiconductor chips 1 is mounted in each of the plurality of insulating substrates 5. The insulating substrate 5 is made of a ceramic material for example. Further, as illustrated in FIG. 3, each of the plurality of semiconductor chips 1 includes the principal surface 1a, the rear surface 1b on the opposite side of the principal surface 1a, and the semiconductor substrate 1k made of SiC. In other words, the semiconductor chip 1 is a power semiconductor chip made of SiC. In addition, in the principal surface 1a of each of the plurality of semiconductor chips 1, there is formed the front surface electrode 1c which has the Al alloy film 1cc containing the columnar Al crystal 1cd illustrated in FIG. 7. In addition, the Al alloy film 1cc contains a high melting-point metal. The high melting-point metal includes any one of Ta, Nb, Re, Zr, W, Mo, V, Hf, Ti, Cr, and Pt for example. Further, in each of the plurality of semiconductor chips 1, the intermetallic compound 1cf made of the high melting-point metal and Al is precipitated in the Al alloy film 1cc of the front surface electrode 1c.

Then, each of the plurality of semiconductor chips 1 is mounted on a Cu electrode 5c which is a wiring portion formed in an upper surface 5a of the insulating substrate 5, and mounted through a die bonding material such as a sintered Cu (sintered metal) 3. In other words, the rear surface 1b of the semiconductor chip 1 and the Cu electrode 5c of the upper surface 5a of the insulating substrate 5 are bonded through the sintered Cu 3.

In addition, each of the plurality of semiconductor chips 1 is electrically connected to the other Cu electrode 5c of the insulating substrate 5 through an Al wire (conductive member) 11. At that time, in each of the plurality of semiconductor chips 1, the Al alloy film 1cc of the front surface electrode 1c of each semiconductor chip 1 and the Al wire 11 are electrically connected.

Further, each of the plurality of insulating substrates 5 is a substrate which is formed of a ceramic material for example.

In addition, each of the plurality of insulating substrates 5 is mounted in a base plate 4 through a solder 2. In other words, a lower surface 5b of each of the plurality of insulating substrates 5 is bonded to the base plate 4 through the solder 2. Further, the base plate 4 is a Ni-plated Cu plate for example.

In addition, a Cu bus bar (P main terminal) 6, a Cu bus bar (N main terminal) 7, and a Cu bus bar (AC main terminal) 8 are provided as lead terminals in the power module 10. In other words, the Cu bus bars 6, 7, and 8 are electrically connected to any Cu electrode 5c formed in the upper surface 5a of the insulating substrate 5 and, for example, electrically connected between the insulating substrates 5 or used as an outer connection terminal to the outside of the module.

Then, parts (inner portions) of the plurality of insulating substrates 5, the plurality of semiconductor chips 1, the plurality of Al wires 11, and the Cu bus bars 6, 7, and 8 are covered by a case 12. The case 12 is made of resin for example, and attached to the insulating substrate 5.

Further, a resin 9 which is a gel such as silicone is filled in the inner portion of the case 12. Parts (the inner portion) of the plurality of insulating substrates 5, the plurality of semiconductor chips 1, the plurality of Al wires 11, and the Cu bus bars 6, 7, and 8 are sealed by the resin 9.

Further, the other parts of the Cu bus bars 6, 7, and 8 are exposed to the outside from the case 12 as an external connecting terminal.

Herein, FIG. 13 schematically illustrates a junction state from the semiconductor chip 1 to the base plate 4 in the power module 10 illustrated in FIG. 12. Specifically, the Al alloy film 1cc of the front surface electrode 1c of the semiconductor chip 1 is electrically connected to the Al wire 11. Then, the semiconductor chip 1 is mounted to the Cu electrode 5c (a wiring portion of the insulating substrate 5) through the sintered Cu 3 which is a sintered metal. Further, the sintered metal used as a die bonding material of the semiconductor chip 1 may be a sintered Ag other than the sintered Cu 3.

Figure 14:
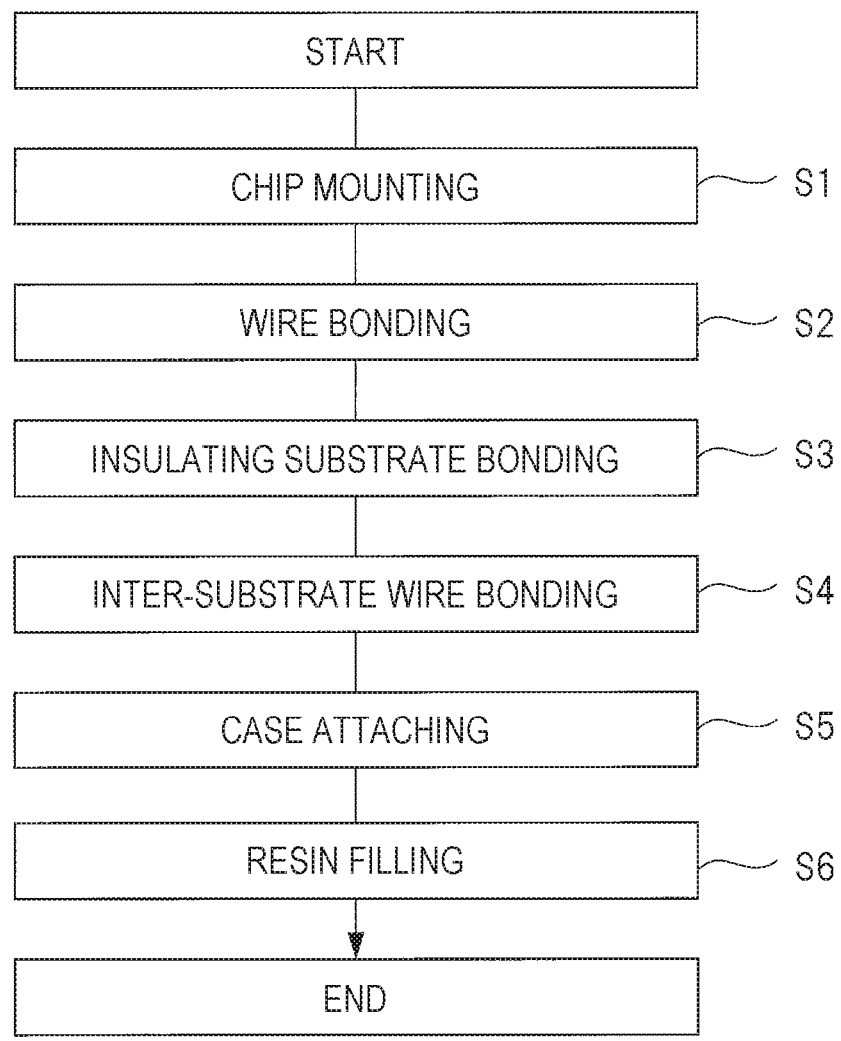
FIG. 14 is a flowchart illustrating an example of a manufacturing method of the power module illustrated in FIG. 12.

Then, the insulating substrate 5 mounted with the semiconductor chip 1 is mounted in the base plate 4 through the solder 2. Next, assembling of the power module 10 of this embodiment will be described. FIG. 14 is a flowchart illustrating an example of a manufacturing method of the power module illustrated in FIG. 12.

First, as illustrated in FIG. 3, there is prepared the semiconductor chip 1 formed with the front surface electrode 1c having the Al alloy film 1cc where the high melting-point metal is contained. On the other hand, the insulating substrate 5 where the Cu electrode 5c (wiring portion) is formed on both front and rear sides is prepared in a desired place.

Herein, as illustrated in FIG. 3, the semiconductor chip 1 includes the principal surface 1a and the rear surface 1b, and includes the semiconductor substrate 1k made of SiC. Then, the high melting-point metal is any one of Ta, Nb, Re, Zr, W, Mo, V, Hf, Ti, Cr, and Pt for example. In addition, the Al alloy film 1cc includes the columnar Al crystal 1cd as illustrated in FIG. 7. Further, in the Al alloy film 1cc in each of the semiconductor chips 1, the intermetallic compound 1cf made of the high melting-point metal and Al is precipitated in the Al alloy film 1cc of the front surface electrode 1c.

Next, a chip mounting is implemented in step S1 of FIG. 14. Herein, the semiconductor chip 1 in which the front surface electrode 1c which includes the Al alloy film 1cc containing the high melting-point metal is provided in the principal surface 1a is mounted on the Cu electrode 5c (wiring portion) which is provided in the upper surface 5a of the insulating substrate 5. At that time, the sintered Cu 3 is employed as a die bonding material. In other words, the semiconductor chip 1 is mounted to the insulating substrate 5 through the sintered Cu 3 by heating and loading.

After the chip mounting, a wire bonding illustrated in step S2 of FIG. 14 is implemented. Herein, the front surface electrode 1c of the semiconductor chip 1 is electrically connected to the Cu electrode 5c of the insulating substrate 5 by the Al wire (conductive member) 11.

In detail, in each of the plurality of semiconductor chips 1, the Al alloy film 1cc of the front surface electrode 1c of the semiconductor chip 1 illustrated in FIG. 3 is electrically connected to the Cu electrode 5c of the upper surface 5a of the insulating substrate 5 illustrated in FIG. 12 using the Al wire 11.

After the wire bonding, an insulating substrate bonding illustrated in step S3 of FIG. 14 is implemented. Herein, each insulating substrate 5 wire-bonded onto the insulating substrate 5 is bonded to the base plate 4 through the solder 2. At that time, the solder 2 is heated at a temperature as low as the sintered Cu 3 used in the chip mounting is not melted, and the insulating substrate 5 is pressed, so that the insulating substrate 5 is bonded to the base plate 4.

After the insulating substrate bonding, an inter-substrate wire bonding illustrated in step S4 of FIG. 14 is implemented. Herein, while not illustrated in the drawing, the Cu electrodes 5c of the adjacent insulating substrates 5 are wire-bonded. The wire bonding method is similar to the wire bonding of step S2. Further, each of the Cu bus bars 6, 7, and 8 is attached to the Cu electrode 5c of a desired insulating substrate 5 by ultrasonic compression.

After the inter-substrate wire bonding, a case attaching illustrated in step S5 of FIG. 14 is implemented. Herein, the case 12 is bonded to the base plate 4 to cover parts (inner portions) of the plurality of insulating substrates 5, the plurality of semiconductor chips 1, the plurality of Al wires 11, and the Cu bus bars 6, 7, and 8. At that time, the case 12 is attached to the base plate 4 such that the other portions of the Cu bus bars 6, 7, and 8 protrude from the case 12 as the external connecting terminals. Further, the case 12 is formed in a box shape made of resin for example.

After the case attaching, a resin filling illustrated in step S6 of FIG. 14 is implemented. Herein, the resin 9 is made to flow into the case 12 from a hole (not illustrated) which is provided in the case 12, so that the case 12 is filled with the resin 9. Therefore, parts (inner portions) of the plurality of insulating substrates 5, the plurality of semiconductor chips 1, the plurality of Al wires 11, and the Cu bus bars 6, 7, and 8 are sealed with the resin 9. Further, the other parts of the Cu bus bars 6, 7, and 8 come to protrude from the case 12 as the external connecting terminals of the power module 10. Finally, the assembling of the power module 10 is completed.

Figure 15:
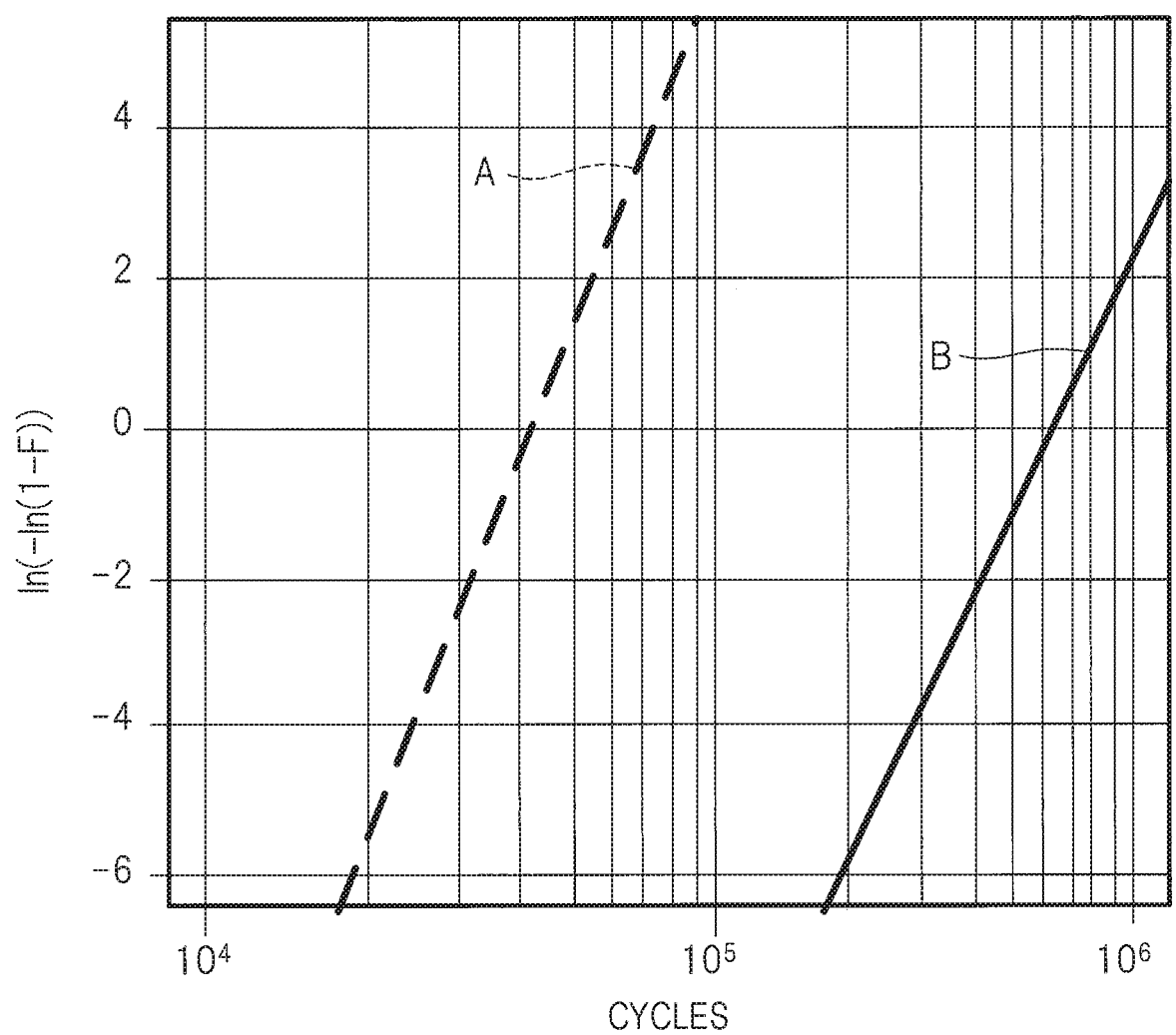
FIG. 15 is a diagram illustrating a result of the power cycle test of the power module according to the embodiment of the invention.

Next, the effects of the power module 10 of this embodiment will be described. FIG. 15 is a diagram illustrating results of the power cycle test of the power module according to the embodiment of the invention. In FIG. 15, a dotted line A illustrates a test result as a comparative example on a condition where the semiconductor chip is bonded using solder, the Al wire 11 is bonded, and the Al alloy film containing no high melting-point metal is applied as an electrode. On the other hand, a solid line B illustrates a test result on a condition that the semiconductor chip is bonded using the sintered Cu, a high-strength Al wire is bonded, and the Al alloy film containing a high melting-point metal is applied as an electrode. Further, the high-strength Al wire indicates an Al wire containing a high melting-point metal.

According to FIG. 15, in a case where the electrode configured to include the Al alloy film 1cc containing a high melting-point metal is employed like the front surface electrode 1c of the semiconductor chip 1 of this embodiment, the life span (the number of cycles of the power cycle test) of the power module 10 can be expanded about ten times as a result of the power cycle test.

In other words, in the semiconductor chip 1 assembled to the power module 10, the grain boundaries exist at a high density in a direction (the thickness direction Z of the Al alloy film 1cc) perpendicular to the Al alloy film 1cc in a metallic structure of the Al alloy film 1cc of the front surface electrode 1c. Further, the intermetallic compound 1cf of $Al_a$Ta is precipitated in plural places in the Al crystal grain boundary ice.

With this configuration, even when an Al crystal shear and a crack occur by thermal stress from the Al wire 11, the growth of the crystal shear and the crack along a horizontal direction (a surface direction of the front surface electrode 1c) can be hindered by the columnar Al crystal 1cd.

As a result, metal fatigue is hard to cause, and the bonding strength between the front surface electrode 1c of the semiconductor chip 1 and the Al wire 11 is increased. Therefore, it is possible to expand a life span of the power module 10 in a power cycle evaluation.

In addition, since a sintered metal such as the sintered Cu 3 is employed as a die bonding material of the semiconductor chip 1 in the power module 10, the sintered metal becomes rigid and has a high thermal resistance. Therefore, the bonding strength of the semiconductor chip 1 can be increased. With this configuration, it is possible to achieve a long life span of the power module 10.

Figure 16:
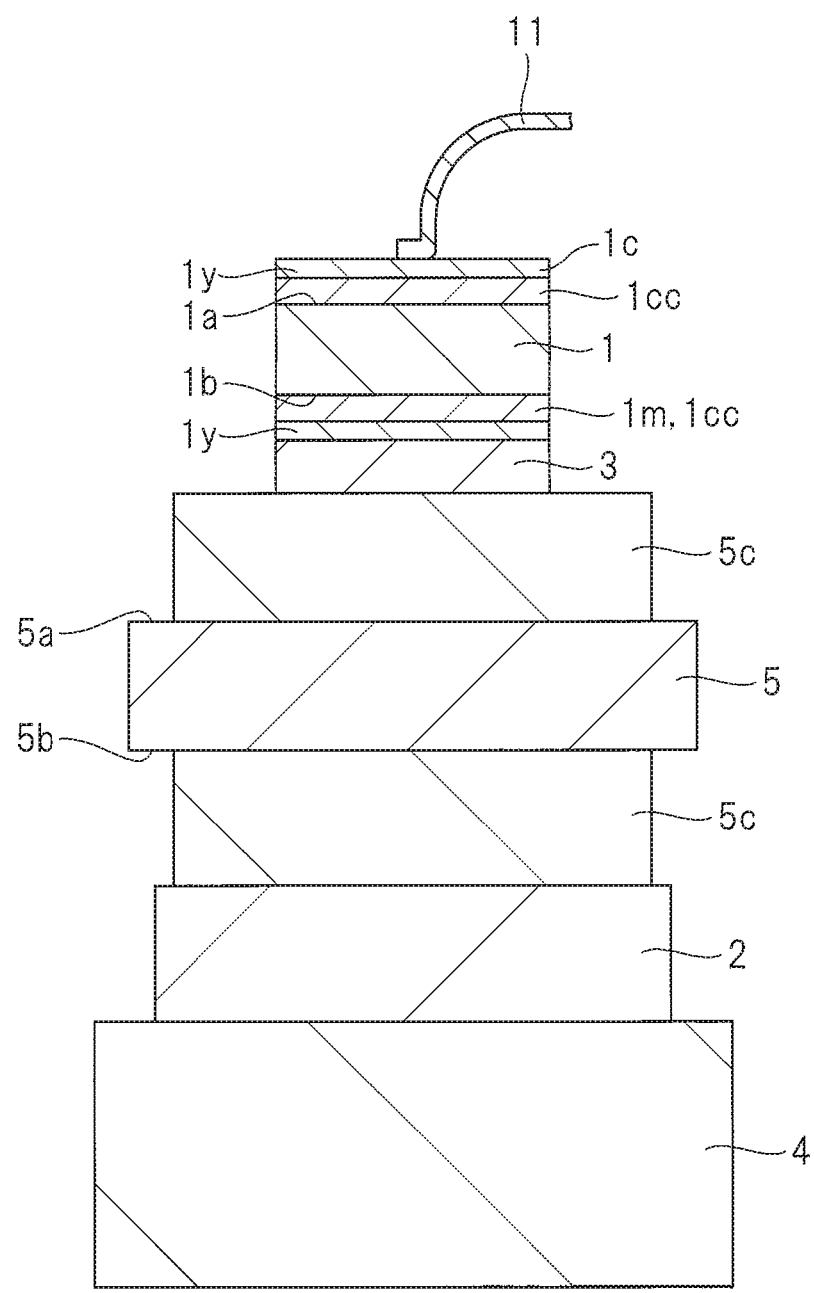
FIG. 16 is a cross-sectional view partially illustrating main parts of a structure of a power module according to a modification of the embodiment of the invention.

Next, a modification of this embodiment will be described. FIG. 16 is a cross-sectional view partially illustrating main parts of the structure of the power module according to the modification of the embodiment of the invention.

In the module structure of the modification illustrated in FIG. 16, a Ni film 1y is formed in the upper layer of the Al alloy film 1cc in the semiconductor chip 1. In other words, the Ni film 1y is laminated on the Al alloy film 1cc in the front surface electrode 1c of the semiconductor chip 1.

With this configuration, the bonding strength between the Al wire 11 and the front surface electrode 1c can be increased still more. Ni is a high melting-point material, and hardly causes a crack to grow in the horizontal direction because a crystal grain hardly becomes large. Therefore, the bonding strength between the Al wire 11 and the front surface electrode 1c can be increased by laminating the Ni film 1y on the Al alloy film 1cc.

In addition, in the module structure of the modification illustrated in FIG. 16, the drain electrode 1m (rear surface electrode) is formed in the rear surface 1b in the semiconductor chip 1. The drain electrode 1m includes the Al alloy film 1cc illustrated in FIG. 3 in which the high melting-point metal is contained. In other words, even in the drain electrode 1m (rear surface electrodes) similarly to the front surface electrode 1c, the drain electrode 1m includes the Al alloy film 1cc, and the Al alloy film 1cc is structured to include the columnar Al crystal 1cd as illustrated in FIG. 6.

With this configuration, even in the drain electrode 1m (rear surface electrode) similarly to the front surface electrode 1c, the growth of the crack in the horizontal direction (the surface direction of the drain electrode 1m) can be hindered by the columnar Al crystal 1cd when a crack occurs in the drain electrode 1m.

As a result, metal fatigue is hard to cause, and the bonding strength of the drain electrode 1m of the semiconductor chip 1 is increased. Therefore, it is possible to expand a life span of the semiconductor chip 1 in the power cycle evaluation.

In addition, in the module structure illustrated in FIG. 16, the Ni film 1y is laminated and formed on the surface (lower layer) of the drain electrode (rear surface electrode) 1m which includes the Al alloy film 1cc of the columnar Al crystal 1cd.

With this configuration, a bonding force with respect to the sintered Cu 3 (die bonding material) can be increased, and a longer life span of the power module 10 can be achieved. Next, an application of this embodiment will be described.

Figure 17:
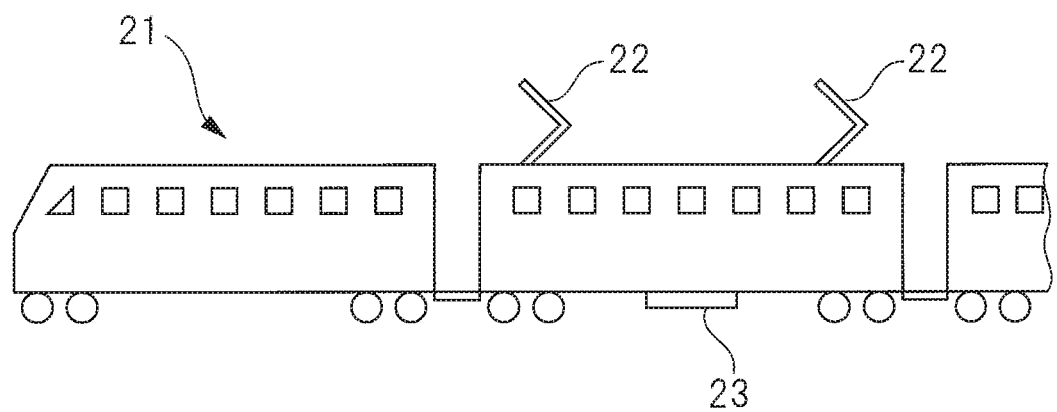
FIG. 17 is a side view partially illustrating a railway vehicle in which an inverter provided with the semiconductor chip according to the embodiment of the invention is mounted.
Figure 18:
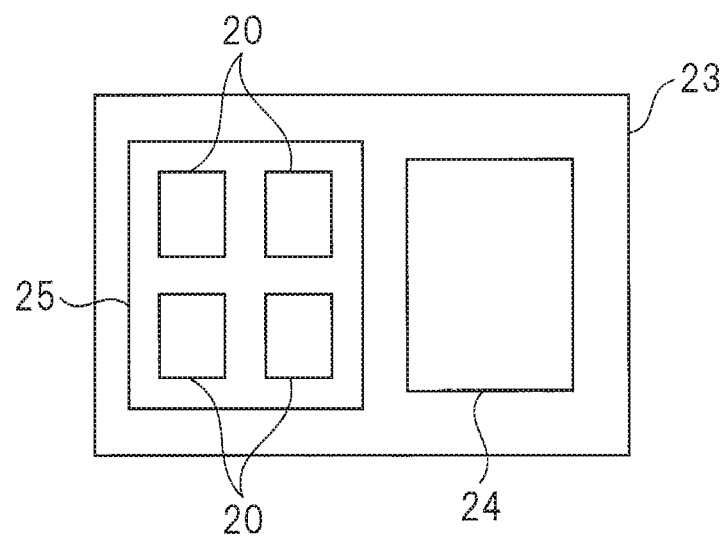
FIG. 18 is a top view illustrating an example of an inner configuration of the inverter installed in the railway vehicle illustrated in FIG. 17.

FIG. 17 is a side view partially illustrating a railway vehicle in which an inverter provided with the semiconductor chip according to the embodiment of the invention is mounted. FIG. 18 is a top view illustrating an example of an inner configuration of the inverter installed in the railway vehicle illustrated in FIG. 17.

Herein, the description will be given about an application where an inverter module 20 assembled with the semiconductor chip 1 as illustrated in FIG. 3 of this embodiment is applied to the railway vehicle.

For example, an inverter (power control device) may be applied to drive a three-phase motor in a railway vehicle 21 illustrated in FIG. 17.

FIG. 18 illustrates one of a plurality of inverters 23 which are provided in the railway vehicle 21 for example. In other words, the inverter module 20 assembled with the semiconductor chip 1 illustrated in FIG. 3 of this embodiment is mounted in the inverter 23 which is installed in the railway vehicle 21 provided with a pantograph 22 (power collecting device).

As illustrated in FIG. 18, a plurality of inverter modules 20 are mounted on a power unit 25 in the inner portion of the inverter 23, and a cooling device 24 is mounted to cool down these inverter modules 20.

Since the inverter module 20 is a power module, the semiconductor chip 1 emits a lot of heat. Therefore, the cooling device 24 is attached to cool down the inner portion of the inverter 23 by cooling down the plurality of inverter modules 20.

In this way, the inverter 23 mounted with the inverter module 20 where the semiconductor chip 1 is assembled as illustrated in FIG. 3 of this embodiment is installed in the railway vehicle 21. Therefore, even in a case where the inside of the inverter 23 becomes a hot environment, the long life spans of the semiconductor chip 1 and the inverter module 20 can be achieved. As a result, it is possible to increase reliability of the inverter 23 and the vehicle 21 which is provided with the inverter.

Hitherto, the invention implemented by the inventor has been specifically described on the basis of the embodiments. However, the invention is not limited to the above-described embodiments, but various modifications can be made. For example, the embodiments are described in a clearly understandable way for the invention, and thus the invention is not necessarily to provide all the configurations described above.

In addition, some configurations of a certain embodiment may be replaced with the configurations of another embodiment, and the configuration of the other embodiment may also be added to the configuration of a certain embodiment. Further, additions, omissions, and substitutions may be made on some configurations of each embodiment using other configurations. Further, while the respective members and relative sizes in the drawings are simplified and idealized in order to help with understanding on the present invention, the structure may be a more complicate shape in practice.

For example, the power module 10 in the embodiments has been described about a case where a die bonding material for fixing the semiconductor chip 1 is a sintered metal such as sintered Cu or sintered Ag. However, the die bonding material may be any bonding material other than the sintered metal as long as the material has a high thermal resistance.

In addition, a wire to be bonded to the Al alloy film 1cc of the front surface electrode 1c of the semiconductor chip 1 in the power module 10 is not limited to the Al wire 11, but may be a plate Cu wire.

In addition, the semiconductor chip 1 is not limited to a SiC substrate, but may be a Si substrate.

In addition, the semiconductor chip 1 in the embodiment has been described using a MOSFET as an example. However, the semiconductor chip 1 is not limited to the MOSFET, but may be mounted to other power modules.

What is claimed is:

1. A semiconductor chip comprising:
a semiconductor substrate; and
a front surface electrode which is formed in a principal surface of the semiconductor substrate,
wherein the front surface electrode includes an Al alloy film which contains a high melting-point metal, and
the Al alloy film contains a columnar Al crystal along a thickness direction of the Al alloy film.

2. The semiconductor chip according to claim 1, wherein the semiconductor substrate is made of SiC.

3. The semiconductor chip according to claim 1, wherein the high melting-point metal is any one of Ta, Nb, Re, Zr, W, Mo, V, Hf, Ti, Cr, and Pt.

4. The semiconductor chip according to claim 1, wherein a Ni film is formed in an upper layer of the Al alloy film, and
the Al alloy film and the Ni film are laminated.

5. The semiconductor chip according to claim 1, wherein an intermetallic compound made of the high melting-point metal and Al is precipitated in the Al alloy film.

6. A power module comprising:
a semiconductor chip which includes a principal surface and a rear surface on an opposite side of the principal surface, and is provided with a front surface electrode formed in the principal surface;
a substrate which supports the semiconductor chip and includes a wiring portion; and
a conductive member which electrically connects the front surface electrode of the semiconductor chip and the wiring portion of the substrate,
wherein the front surface electrode of the semiconductor chip includes an Al alloy film which contains a high melting-point metal, and
the Al alloy film contains a columnar Al crystal which extends along a thickness direction of the Al alloy film.

7. The power module according to claim 6, wherein the semiconductor chip includes a semiconductor substrate which is made of SiC.

8. The power module according to claim 6, wherein the high melting-point metal is any one of Ta, Nb, Re, Zr, W, Mo, V, Hf, Ti, Cr, and Pt.

9. The power module according to claim 6, wherein the conductive member is an Al wire.

10. The power module according to claim 6, wherein the semiconductor chip is mounted on the substrate through a sintered metal.

11. The power module according to claim 6, wherein an intermetallic compound made of the high melting-point metal and Al is precipitated in the Al alloy film of the front surface electrode of the semiconductor chip.

12. The power module according to claim 6, wherein a rear surface electrode is formed in the rear surface of the semiconductor chip, and
the rear surface electrode includes an Al alloy film which contains a high melting-point metal.

13. The power module according to claim 6, wherein the front surface electrode formed in the principal surface of the semiconductor chip includes a metal film in a lower layer of the Al alloy film.

14. A manufacturing method of a power module, comprising:
(a) mounting a semiconductor chip on a substrate provided with a wiring portion, the semiconductor chip including a principal surface and a rear surface on an opposite side of the principal surface, and being provided with a front surface electrode which is formed in the principal surface and includes an Al alloy film containing a high melting-point metal; and
(b) electrically connecting the front surface electrode of the semiconductor chip and the wiring portion of the substrate by a conductive member after the (a), wherein the Al alloy film of the front surface electrode of the semiconductor chip contains a columnar Al crystal which extends along a thickness direction of the Al alloy film.

15. The manufacturing method of the power module according to claim 14,
wherein the semiconductor chip includes a semiconductor substrate which is made of SiC,
the high melting-point metal is any one of Ta, Nb, Re, Zr, W, Mo, V, Hf, Ti, Cr, and Pt, and
in the (b), the front surface electrode of the semiconductor chip and the wiring portion of the substrate are electrically connected by an Al wire.

* * * * *